US011804363B2

(12) United States Patent
Ruan et al.

(10) Patent No.: US 11,804,363 B2
(45) Date of Patent: Oct. 31, 2023

(54) CHAMBER COMPONENTS FOR GAS DELIVERY MODULATION

(71) Applicant: Applied Materials, Inc., Santa Clara, CA (US)

(72) Inventors: Fang Ruan, Milpitas, CA (US); Diwakar Kedlaya, San Jose, CA (US); Truong Van Nguyen, San Jose, CA (US); Mingle Tong, San Jose, CA (US); Sherry L. Mings, Sachse, TX (US); Venkata Sharat Chandra Parimi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/088,834

(22) Filed: Nov. 4, 2020

(65) Prior Publication Data

US 2021/0142984 A1    May 13, 2021

Related U.S. Application Data

(60) Provisional application No. 62/932,811, filed on Nov. 8, 2019.

(51) Int. Cl.
*H01J 37/32* (2006.01)
*H01L 21/67* (2006.01)

(52) U.S. Cl.
CPC .... *H01J 37/3244* (2013.01); *H01L 21/67069* (2013.01); *H01J 2237/002* (2013.01); *H01J 2237/332* (2013.01)

(58) Field of Classification Search
CPC ............. H01J 37/3244; H01J 2237/002; H01J 2237/332; H01L 21/67069;
(Continued)

(56) References Cited

U.S. PATENT DOCUMENTS 6,106,625 A * 8/2000 Koai ..................... C23C 16/455
                                                         118/724
6,245,192 B1 * 6/2001 Dhindsa ............ C23C 16/45565
                                                         438/731
(Continued)

FOREIGN PATENT DOCUMENTS

CN    107447204 A    12/2017
CN    109155251 A     1/2019
(Continued)

OTHER PUBLICATIONS

International Search Report and Written Opinion dated Feb. 22, 2021 in International Patent Application No. PCT/US2020/058791, 6 pages.
(Continued)

*Primary Examiner* — Rudy Zervigon
(74) *Attorney, Agent, or Firm* — Kilpatrick Townsend & Stockton LLP

(57) ABSTRACT

Exemplary semiconductor processing chambers may include an inlet manifold defining a central aperture. The inlet manifold may also define a first channel and a second channel, and each of the channels may extend through the inlet manifold radially outward of the central aperture. The chambers may also include a gasbox characterized by a first surface facing the inlet manifold and a second surface opposite the first. The gasbox may define a central aperture aligned with the central aperture of the inlet manifold. The gasbox may define a first annular channel in the first surface extending about the central aperture of the gasbox and fluidly coupled with the first channel of the inlet manifold. The gasbox may define a second annular channel extending radially outward of the first and fluidly coupled with the second channel of the inlet manifold. The second annular channel may be fluidly isolated from the first.

14 Claims, 7 Drawing Sheets

(58) Field of Classification Search
CPC ........... H01L 21/67017; H01L 21/6719; C23C 16/45561; C23C 16/17; C23C 16/45517
USPC .................. 118/715; 156/345.33, 345.34
See application file for complete search history.

(56) References Cited

U.S. PATENT DOCUMENTS

| | | | | |
|---|---|---|---|---|
| 8,317,968 | B2* | 11/2012 | Dhindsa | H01J 37/32091 156/345.37 |
| 8,668,775 | B2* | 3/2014 | Moshtagh | C23C 16/45589 118/724 |
| 9,121,097 | B2* | 9/2015 | Mohn | C23C 16/45565 |
| 10,900,122 | B2* | 1/2021 | Shugrue | C23C 16/45561 |
| 2003/0124842 | A1 | 7/2003 | Hytros et al. | |
| 2004/0216844 | A1 | 11/2004 | Janakiraman et al. | |
| 2007/0251642 | A1* | 11/2007 | Bera | H01J 37/32082 156/345.43 |
| 2009/0159213 | A1* | 6/2009 | Bera | H01J 37/3244 156/345.34 |
| 2009/0162261 | A1* | 6/2009 | Baera | H01J 37/3244 422/186.04 |
| 2009/0162262 | A1* | 6/2009 | Bera | H01J 37/3244 422/186.04 |
| 2012/0234945 | A1* | 9/2012 | Olgado | C23C 16/45572 239/589 |
| 2014/0291286 | A1* | 10/2014 | Okayama | C23C 16/45519 239/548 |
| 2017/0338134 | A1 | 11/2017 | Tan et al. | |
| 2018/0269036 | A1* | 9/2018 | Huang | C23C 16/45563 |
| 2018/0350562 | A1* | 12/2018 | Baluja | C23C 16/401 |

FOREIGN PATENT DOCUMENTS

| | | |
|---|---|---|
| KR | 2017-0136432 A | 12/2017 |
| TW | I668322 B | 8/2019 |
| WO | 03-064059 A2 | 8/2003 |

OTHER PUBLICATIONS

Application No. PCT/US2020/058791 , International Preliminary Report on Patentability, dated May 19, 2022, 5 pages.

* cited by examiner

CHAMBER COMPONENTS FOR GAS DELIVERY MODULATION

CROSS REFERENCES TO RELATED APPLICATIONS

This application claims the benefit of priority to U.S. Patent Application No. 62/932,811 filed Nov. 8, 2019, the contents of which are hereby incorporated by reference in their entirety for all purposes.

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

SUMMARY

Exemplary semiconductor processing chambers may include an inlet manifold defining a central aperture. The inlet manifold may also define a first channel and a second channel, each of the first channel and the second channel extending through the inlet manifold radially outward of the central aperture. The processing chambers may also include a gasbox characterized by a first surface facing the inlet manifold and a second surface opposite the first surface. The gasbox may define a central aperture axially aligned with the central aperture of the inlet manifold. The gasbox may define a first annular channel in the first surface extending about the central aperture of the gasbox and fluidly coupled with the first channel defined by the inlet manifold. The gasbox may define a second annular channel extending radially outward of the first annular channel and fluidly coupled with the second channel defined by the inlet manifold. The second annular channel may be fluidly isolated from the first annular channel.

In some embodiments, the second annular channel may be defined in the first surface of the gasbox and extend about and concentric with the first annular channel. The gasbox may define fluid access from the second annular channel to a plurality of delivery channels defined within the gasbox and extending radially outward from the second annular channel. Each delivery channel of the plurality of delivery channels may define one or more outlet apertures positioned radially outward of the second annular channel. The second annular channel may be defined at the second surface of the gasbox. The second channel of the inlet manifold may be fluidly coupled with an inlet aperture extending through the gasbox from the first surface to the second surface. The second annular channel may define a plurality of outlet apertures extending towards a processing region of the semiconductor processing chamber. The inlet aperture through the gasbox may be fluidly coupled with one or more conductance paths defined at the second surface and extending from the inlet aperture through the gasbox to the second annular channel. The one or more conductance paths may be or include a recursive path extending radially outward to the second annular channel. The gasbox may define a cooling channel in the first surface of the gasbox radially outward of the first annular channel. The gasbox may define a plurality of delivery apertures through the first annular channel of the gasbox. The plurality of delivery apertures may provide fluid access between the first annular channel and the central aperture of the gasbox.

Some embodiments of the present technology may encompass semiconductor processing chamber gasboxes. The gasboxes may include a first surface and a second surface opposite the first surface. The semiconductor processing chamber gasbox may define a central aperture extending through the semiconductor processing chamber gasbox along a central axis through the semiconductor processing chamber gasbox. The semiconductor processing chamber gasbox may define a first annular channel in the first surface extending about the central aperture of the semiconductor processing chamber gasbox. The semiconductor processing chamber gasbox may define a second annular channel extending radially outward of the first annular channel and fluidly accessible from the first surface of the semiconductor processing chamber gasbox. The second annular channel may be fluidly isolated from the first annular channel.

In some embodiments the second annular channel may be defined in the first surface of the gasbox and extend about and concentric with the first annular channel. The gasbox may define fluid access from the second annular channel to a plurality of delivery channels defined within the gasbox and extending radially outward from the second annular channel. Each delivery channel of the plurality of delivery channels may define one or more outlet apertures positioned radially outward of the second annular channel. The second annular channel may be defined in the second surface of the gasbox. An inlet aperture may extend through the gasbox from the first surface to the second surface. The second annular channel may define a plurality of outlet apertures. The inlet aperture through the gasbox may be fluidly coupled with one or more conductance paths defined at the second surface and extending from the inlet aperture through the gasbox to the second annular channel. The one or more conductance paths may be or include a recursive path extending radially outward to the second annular channel. The gasbox may define a cooling channel in the first surface of the gasbox radially outward of the first annular channel. The gasbox may define a plurality of delivery apertures through the first annular channel of the gasbox. The plurality of delivery apertures may provide fluid access between the first annular channel and the central aperture of the gasbox.

Some embodiments of the present technology may encompass semiconductor processing system. The systems may include a semiconductor processing chamber. The systems may include an inlet manifold coupled with the semiconductor processing chamber and defining a central aperture providing fluid access into the semiconductor processing chamber. The inlet manifold may further define a first channel and a second channel, each of the first channel and the second channel extending through the inlet manifold at a location radially outward of the central aperture. The systems may include a blocker plate providing fluid access to a processing region of the semiconductor processing chamber. The systems may include a gasbox characterized by a first surface facing the inlet manifold and a second surface opposite the first surface. The gasbox may define a central aperture axially aligned with the central aperture of the inlet manifold. The gasbox may define a first annular channel in the first surface extending about the central aperture of the gasbox and fluidly coupled with the first channel defined by the inlet manifold. The gasbox may define a second annular channel formed radially outward of the first annular channel and fluidly coupled with the second channel defined by the inlet manifold. The gasbox may also define a cooling channel formed radially outward of the first annular channel and defined in the first surface of the gasbox. In some embodiments the gasbox may define a first fluid port providing fluid access to the cooling channel. The gasbox may define a second fluid port providing fluid access from the cooling channel.

Such technology may provide numerous benefits over conventional systems and techniques. For example, embodiments of the present technology may allow controlled dilution and distribution of precursors in mid or outer regions of a substrate. Additionally, the chambers and components may allow multiple precursors to be delivered in a number of configurations into a processing region or through a lid stack. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
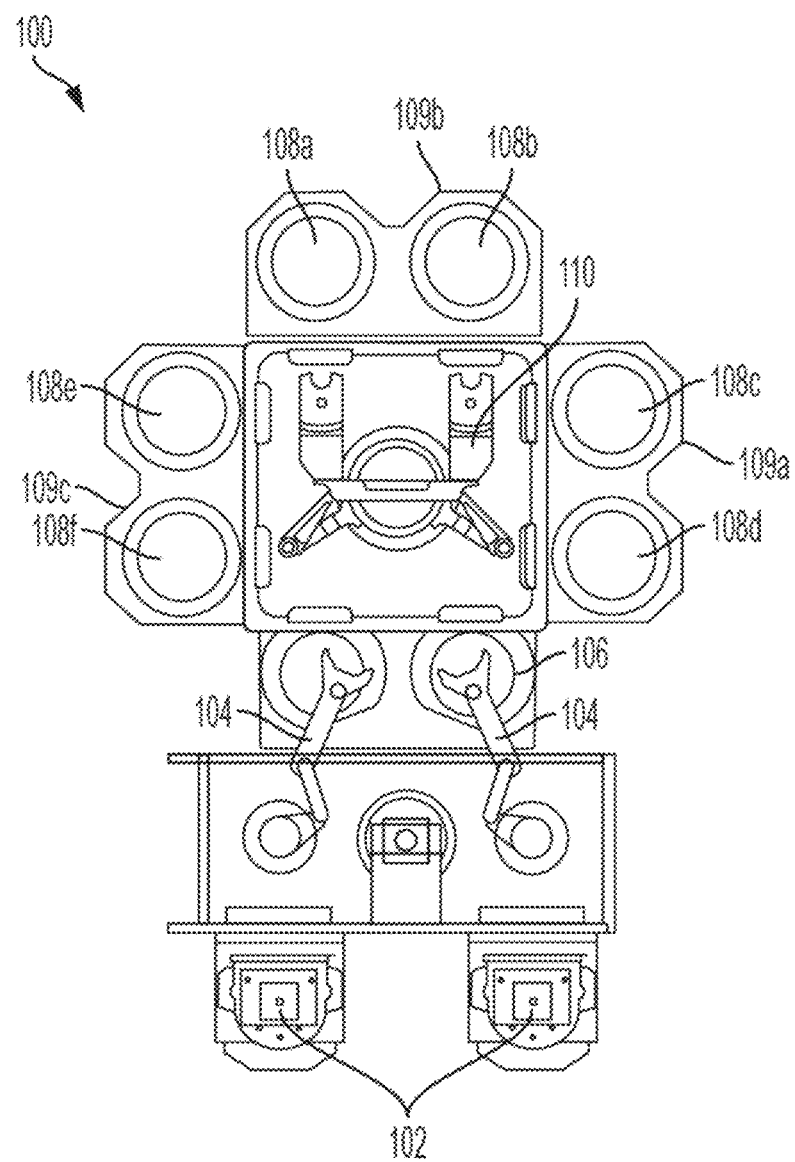
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral uniformity of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film property differences as well as differences across the substrate for materials produced or removed. Adjusting processes at different regions of the substrate, such as for in-plane distortion issues and other film property challenges may be difficult to improve with uniform delivery chamber components, and many conventional technologies have been limited in the adjustments available, or may require specialized components to be produced.

The present technology overcomes these challenges by utilizing one or more chamber components that may facilitate delivery adjustments which may increase or decrease delivery of precursors, such as with dilution, or may afford avenues for material adjustments to the films based on additional precursor inclusion or modulation. Accordingly, improved film formation and removal, as well as improved film properties, may be afforded.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
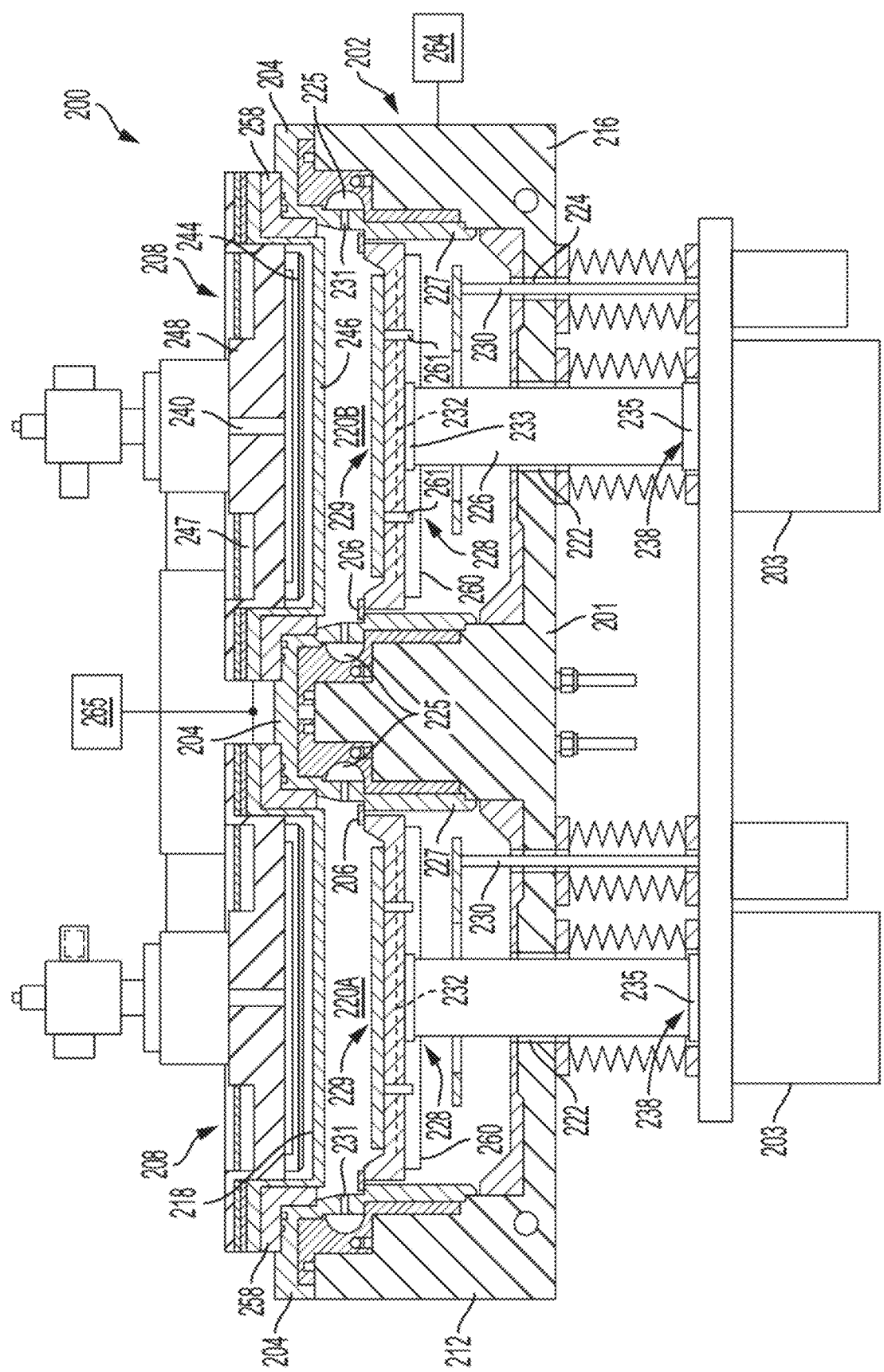
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
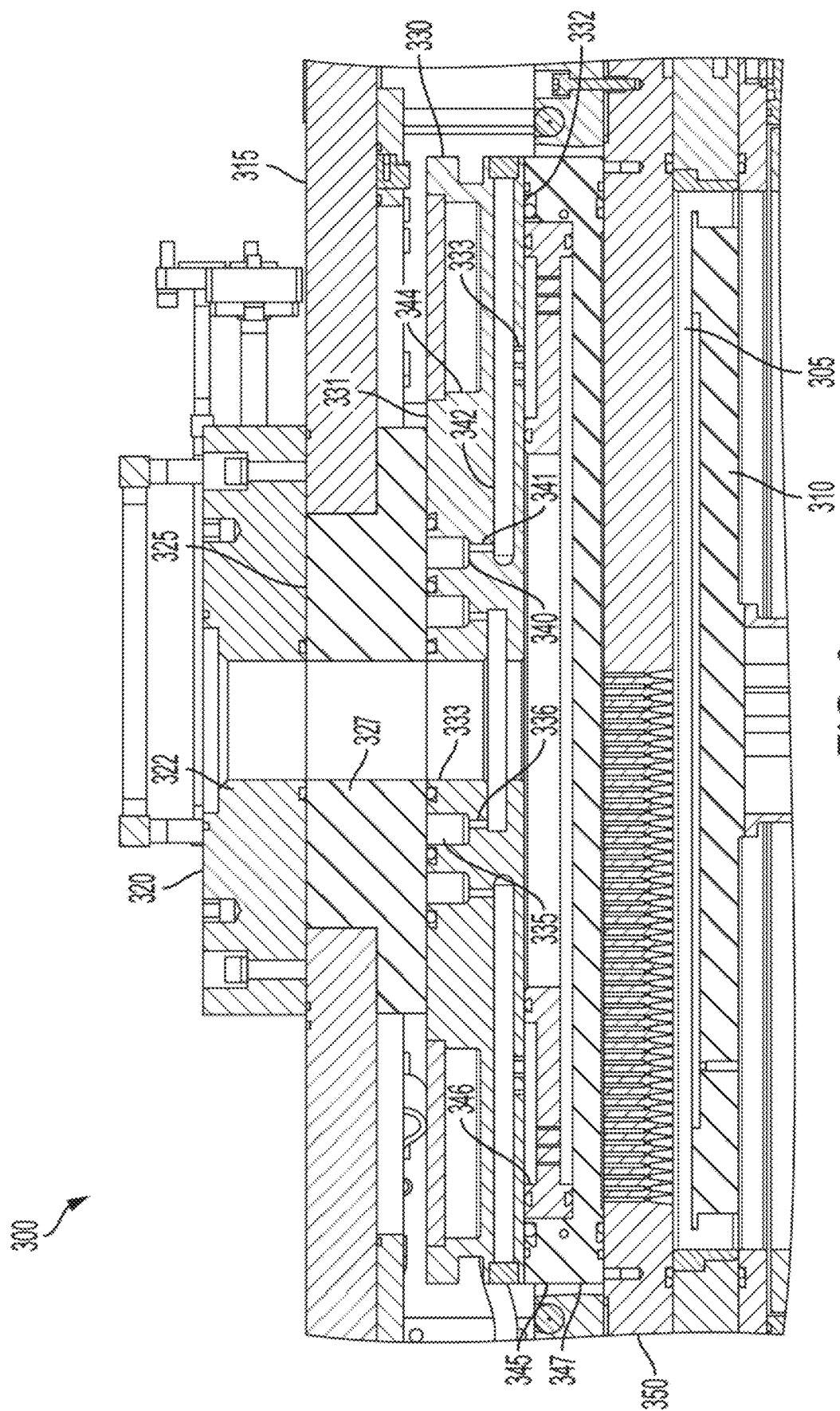
FIG. 3 shows a schematic partial cross-sectional view of an exemplary processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. Chamber 300 is understood to include any feature or aspect of system 200 discussed previously in some embodiments. The chamber 300 may be used to perform semiconductor processing operations including deposition of hardmask materials as previously described, as well as other deposition, removal, and cleaning operations. Chamber 300 may show a partial view of a processing region of a semiconductor processing system, and may not include all of the components, such as a remote plasma unit as illustrated previously, and which are understood to be incorporated in some embodiments of chamber 300.

As noted, FIG. 3 may illustrate a portion of a processing chamber 300. The chamber 300 may include a number of lid stack components, which may facilitate delivery or distribution of materials through the processing chamber into a processing region 305, such as where a substrate may be positioned on a pedestal 310, for example. A chamber lid plate 315 may extend across one or more plates of the lid stack and may provide structural support for components, such as a remote plasma unit illustrated previously for system 200. The lid plate 315 may provide access, such as through an aperture to an internal volume of processing chamber 300. An inlet manifold 320 may be positioned on the lid plate and may provide coupling with a remote plasma unit, which may provide precursors or plasma effluents for chamber cleaning or other processing operations. Inlet manifold 320 may define a central aperture 322, which may extend about a central axis of the chamber or inlet manifold. The inlet manifold may additionally define one or more additional channels, which may include angled, arcuate, or other aperture features for additional fluid delivery, and as may be described further below. The additional channels may at least partially extend through the inlet manifold towards the processing region of the chamber.

Processing chamber 300 may also include an insulator 325, which may electrically or thermally separate the inlet manifold from other lid stack components. Insulator 325 may also define a central aperture 327, which may be axially aligned with the central aperture 322 of the inlet manifold 320. Insulator 325 may also define one or more additional apertures that may be aligned with the one or more additional channels of the inlet manifold, and may extend the channels formed through the insulator towards the processing region. Processing chamber 300 may also include a gasbox 330, on which the insulator may be positioned.

Gasbox 330 may be characterized by a first surface 331 and a second surface 332 that may be opposite the first surface. The gasbox may define a central aperture 333, which may extend fully through the gasbox from the first surface to the second surface. The central aperture 333 may be axially aligned with the central aperture of the inlet manifold 320, and may be axially aligned with the central aperture of the insulator 325. The apertures may define a channel, which may be at least partially used to deliver plasma effluents from a remote plasma unit positioned on the inlet manifold. Gasbox 330 may also define one or more channels that may be fluidly accessed from the one or more additional channels of the inlet manifold, and may allow multiple precursors to be delivered through the lid stack in a variety of flow profiles.

For example, gasbox 330 may define a first annular channel 335 extending at least partially through the gasbox from first surface 331. As will be explained further below, first annular channel 335 may be fluidly accessed from a first channel through the inlet manifold. In some embodiments, first annular channel 335 may be concentric with the central aperture 333 of the gasbox. Gasbox 330 may also define one or more delivery apertures 336. Delivery apertures 336 may be defined through the first annular channel 335. A lateral or radial cutout as illustrated may extend radially outward within the central aperture of the gasbox, and may provide fluid access from the delivery apertures 336. Consequently, delivery apertures 336 may provide fluid access between the first annular channel 335 and the central aperture 333 of the gasbox. Hence, one or more precursors delivered through the first channel through the inlet manifold may bypass a remote plasma unit and be delivered to the central aperture of the gasbox at the gasbox.

Gasbox 330 may also define a second annular channel in some embodiments, one of which is illustrated in FIG. 3. The second annular channel 340 as illustrated may be formed radially outward of the first annular channel, and may be coupled with a second channel defined through the inlet manifold. The second annular channel may be fluidly isolated from the first annular channel in some embodiments, which may maintain a controlled fluid distribution through the lid stack. Second annular channel 340 may be defined in one or more ways within the gasbox, and various options are described in detail below for illustration, although are not intended to limit the technology or claims. Some deposition or etch materials may cause non-uniformity at the substrate surface, which may cause profile or film property changes across the substrate. By allowing additional precursor delivery at a radially outward location, additional precursors may be delivered, which may bolster growth, such as by delivering additional processing precursors, or may deliver diluents that may reduce deposition or etch processes at locations across the substrate.

As illustrated in FIG. 3, second annular channel 340 may also be defined in the first surface of the gasbox with first annular channel 335. In this configuration, the second annular channel may extend about the first annular channel. The second annular channel may be concentric with the first annular channel as well. The gasbox may define a number of delivery apertures 341 extending from the second annular channel, similar to the delivery apertures 336 extending from the first annular channel 335. The delivery apertures 341 may provide fluid access from the second annular channel to a number of configurations. In one example, as illustrated, each delivery aperture 341 may fluidly access a delivery channel 342, which may be defined within the gasbox, and may extend radially outward from the second annular channel, such as in a spoke formation, for example. Along each delivery channel 342 may be one or more outlet apertures 343, which may provide fluid access from the gasbox for precursors introduced through a second channel through the inlet manifold. Outlet apertures 343 may be positioned radially outward of the second annular channel in some embodiments. Gasbox 330 may also define a cooling channel 344, which may also be defined in the first surface of the gasbox, and may extend about one or more of the central aperture 333, first annular channel 335, or second annular channel 340.

Semiconductor processing chamber 300 may also include additional components in some embodiments, such as a blocker plate 345, and a faceplate 350. Blocker plate 345 may define a number of apertures that may increase radial diffusion to improve uniformity of delivery. In some embodiments as illustrated, blocker plate 345 may include one or more plates, and may include a first plate 346 and a second plate 347 in some embodiments. For example, first plate 346 may be at least partially seated on second plate 347. Second plate 347 may include or define a number of apertures through the blocker plate. First plate 346 may be included to further distribute precursors exiting from the outlet apertures 343 as described above. First plate 346 may provide an additional radial extension for the precursors, and the plate may define one or more outlet apertures to provide access to second plate 347. Blocker plate 345, which may be or include second blocker plate 347, may be a first location through the lid stack where precursors delivered to the first annular channel of the gasbox and precursors delivered to the second annular channel of the gasbox may intermix. By allowing an amount of mixing prior to contacting the substrate surface, an amount of overlap may be provided, which may produce a smoother transition at the substrate, and may limit an interface from forming on a film or substrate surface. Faceplate 350 may then deliver precursors to the processing region, which may be at least partially defined from above by the faceplate.

Figure 4:
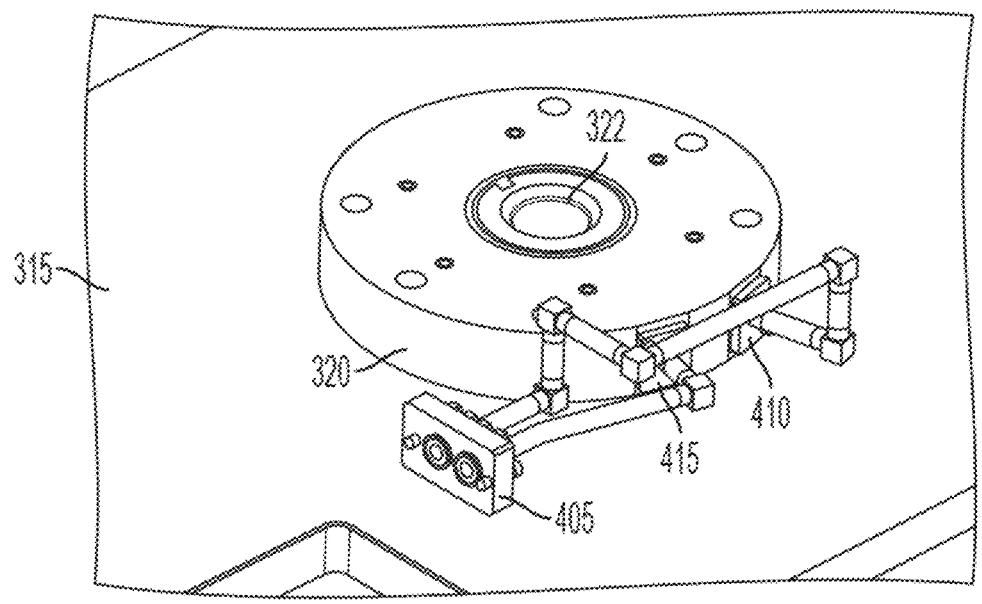
FIG. 4 shows a schematic partial isometric view of a portion of an exemplary substrate processing chamber according to some embodiments of the present technology.

FIG. 4 shows a schematic partial isometric view of a portion of an exemplary substrate processing chamber according to some embodiments of the present technology, and may illustrate additional aspects of chamber 300 described above. It is to be understood that any aspect of any chamber or component described previously may be included with any aspect of FIG. 4. The figure may illustrate additional aspects of delivery to the inlet manifold as described previously, and may illustrate access locations for fluid delivery.

As illustrated, inlet manifold 320 may define a central aperture 322, and may define one or more additional apertures or channels for fluid delivery. The manifold may be positioned on lid plate 315, which may support one or more additional components of the semiconductor processing system. Inlet manifold 320 may also define one or more additional access locations, which may provide support for delivering precursors to the first annular channel and the second annular channel of the gasbox. For example, from a gas panel, a fluid manifold 405 may be used to pipe separate fluids to the additional channels in the manifold. For example, a first piping may extend to a first access location 410, which may provide entry to a first channel defined in the inlet manifold. A second piping may extend to a second access location 415, which may provide entry to a second channel defined in the inlet manifold. The channels may define a transition from horizontal to vertical within the manifold. As would be understood, any number of precursors may be delivered through either access in the inlet manifold. For example, one or more deposition precursors, one or more inert gases, one or more etchant precursors, or any other material may be flowed through the inlets.

Figure 5:
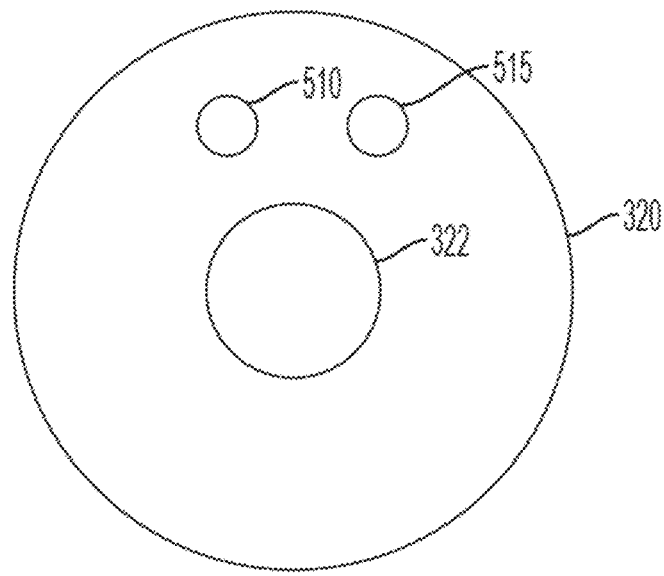
FIG. 5 shows a schematic bottom plan view of an exemplary inlet manifold according to some embodiments of the present technology.

FIG. 5 shows a schematic bottom plan view of an exemplary inlet manifold according to some embodiments of the present technology, and may illustrate a bottom plan view of manifold 320 as described previously. For example, inlet manifold 320 may define a central aperture 322, and may provide first channel 510, which may be an outlet towards a gasbox as previously described for accessing a first annular channel within the gasbox. Additionally, second channel 515 may be an outlet towards a gasbox for accessing a second annular channel within the gasbox. These outlets may extend through additional components, such as an insulator as noted previously, before accessing the gasbox.

Figure 6:
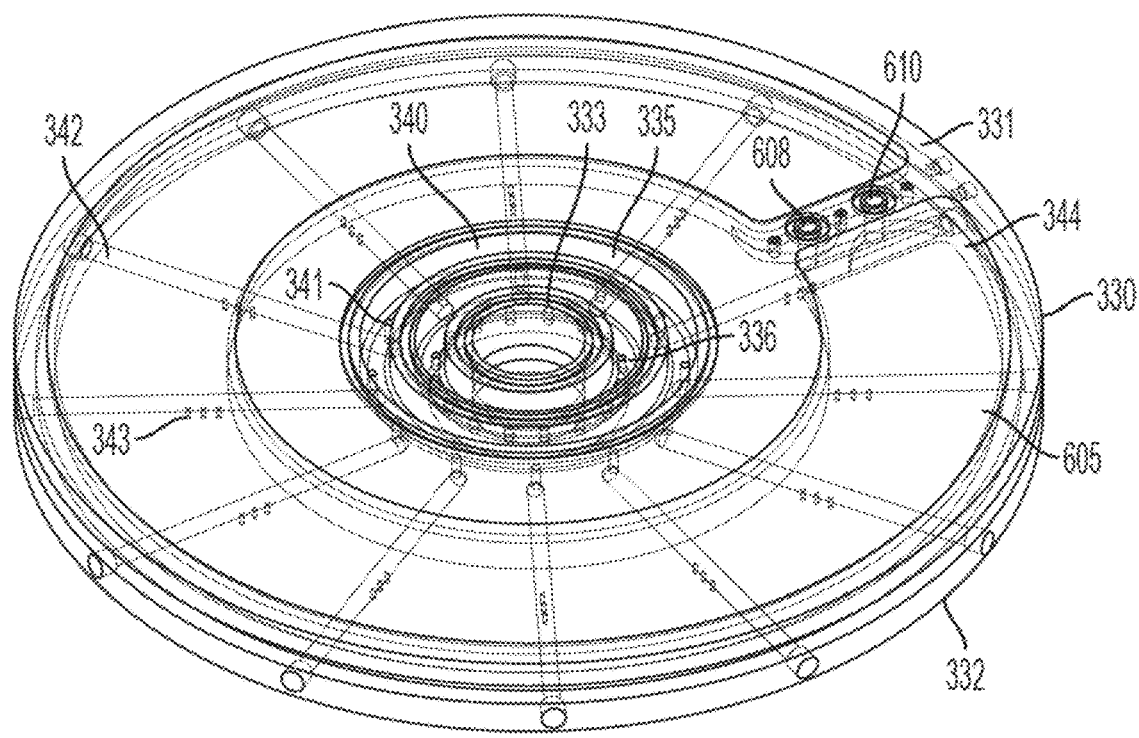
FIG. 6 shows a schematic bottom plan view of an exemplary gasbox according to some embodiments of the present technology.

Turning to FIG. 6 is shown a schematic bottom plan view of an exemplary gasbox 330 according to some embodiments of the present technology. The figure may illustrate additional details of the gasbox to illustrate the fluid delivery from the channels. As previously described, gasbox 330 may be characterized by a first surface 331, such as facing an inlet manifold, for example. Gasbox 330 may also be characterized by a second surface 332 opposite the first, and which may face a processing region, for example. Gasbox 330 may define a central aperture 333, and may define a first annular channel 335, which may be fluidly coupled with the central aperture 333 by a plurality of delivery apertures 336. Additionally, gasbox 330 may define a second annular channel 340, which may be fluidly coupled with a number of radially extending delivery channels 342 through the gasbox 330 by delivery apertures 341. Any number of delivery channels 342 may be included, and one or more outlet apertures 343 may provide access from the gasbox in some embodiments.

FIG. 6 also illustrates a cover plate 605, which may cover a cooling channel 344. Cooling channel 344 may also be defined within first surface 331 of gasbox 330, and may allow a temperature controlled fluid to be delivered to the gasbox. Cover plate 605 may be a similar or different material from gasbox 330, and may be welded, bonded, or otherwise coupled with gasbox 330 to seal cooling channel 344. Cooling channel 344 may be accessed from one or more ports defined in the gasbox. For example, a first port 608 may be defined to provide access to one end of the cooling channel 344, and a second port 610 may be defined to provide access to an opposite end of the cooling channel 344. A cooling fluid may then be circulated through the channel as delivered through one port and retrieved from the other port.

Figure 7:
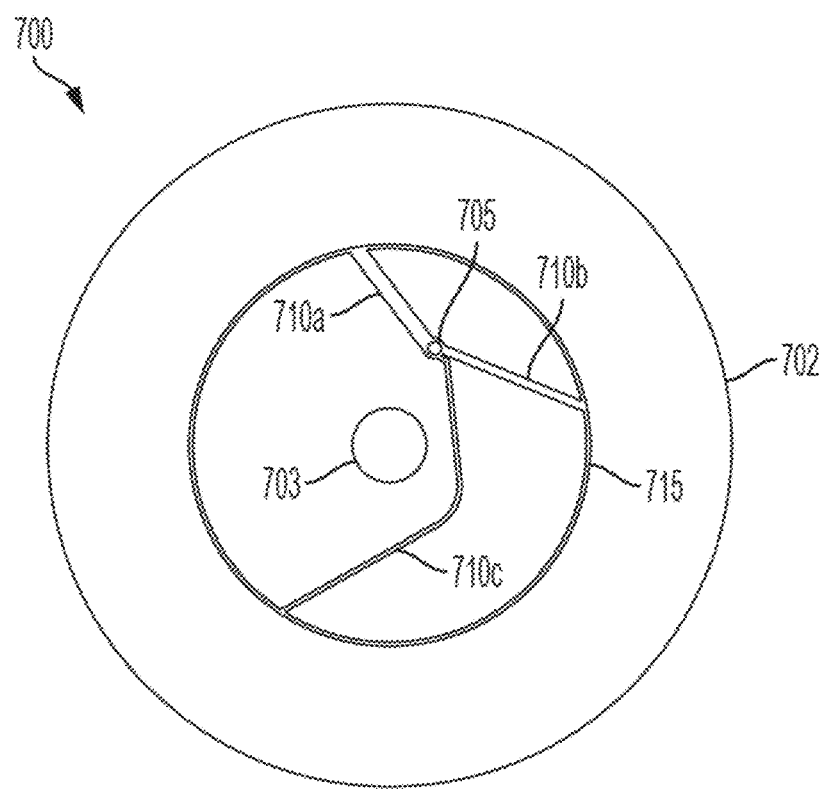
FIG. 7 shows a schematic partial bottom plan view of an exemplary gasbox according to some embodiments of the present technology.

FIG. 7 shows a schematic partial bottom plan view of an exemplary gasbox 700 according to some embodiments of the present technology. Gasbox 700 may include any feature of gasbox configurations or characteristics described above. Additionally, gasbox 700 may be included in any chamber discussed above, or may be part of any lid stack including any previously noted component. Gasbox 700 may include a top surface defining a first annular channel as previously described, and which may deliver precursors to central aperture 703 as discussed above. At second surface 702 may be included or defined a second annular channel 715. Second annular channel 715 may be defined in the second surface, and in some embodiments second annular channel 715 may be formed at second surface 702, such as with a strip channel that may be welded, bonded, or otherwise coupled with the second surface of the gasbox.

An input aperture 705 may extend in line from an inlet manifold, such as from a second channel, and may extend through a first surface of the gasbox. The aperture may extend through the second surface of the gasbox at a location radially outward of the central aperture, and may access delivery channels at an outlet of the input aperture 705. One or more channels 710 may also be included with the strip to distribute the one or more precursors to second annular channel 715, and may fluidly couple the second annular channel 715 with the input aperture 705. For example, channels 710a, 710b, and 710c may be conductance paths, which may be variously sized to provide flow at equal conductance to the second annular channel 715. Second annular channel 715 may then define a plurality of outlet apertures extending from the gasbox, such as towards a processing region within a processing chamber.

It is to be understood that the channels 710 may take a number of forms in addition to the configuration illustrated. For example, in some embodiments for gasbox 700 or gasboxes discussed elsewhere, a recursive flow profile may be formed. As one possible configuration encompassed by the present technology, input aperture 705 may extend to a central or mid location of an arcuate or lateral channel extending outward from input aperture 705. At each distal end of the first channel may be formed an additional or second arcuate or lateral channel extending in two or more directions where the first channel accesses a midpoint of each second channel. Each second channel may then distribute precursors to four separate positions on the second annular channel to increase uniformity of distribution. Additional recursive patterns are also similarly encompassed as may distribute precursors to progressively more positions about the second annular channel.

Figure 8:
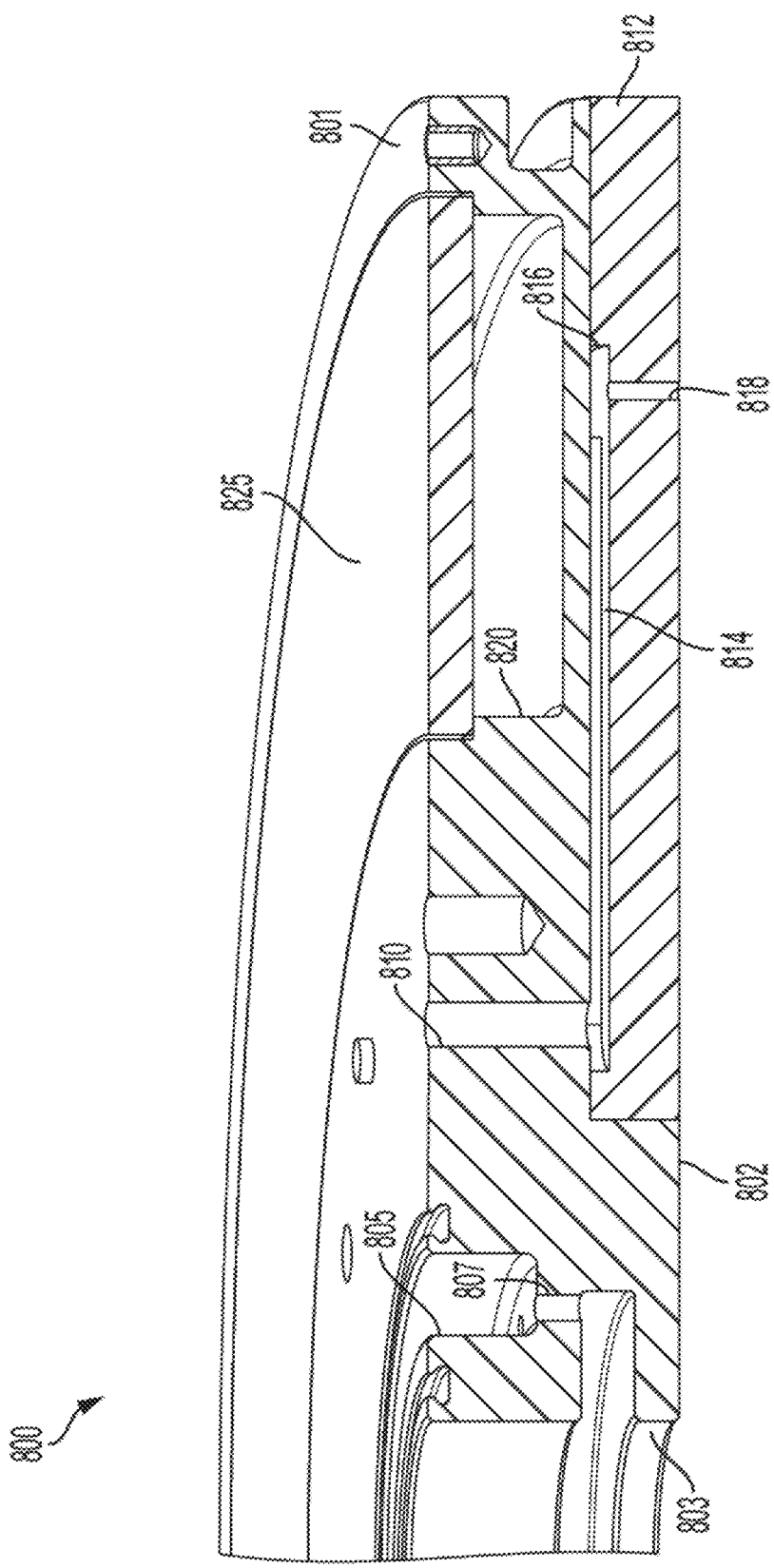
FIG. 8 shows a schematic partial cross-sectional view of an exemplary gasbox according to some embodiments of the present technology.

FIG. 8 shows a schematic partial cross-sectional view of an exemplary gasbox 800 according to some embodiments of the present technology. Gasbox 800 may include any feature of gasbox configurations or characteristics described above. Additionally, gasbox 800 may be included in any chamber discussed above, or may be part of any lid stack including any previously noted component. Gasbox 800 may include a first surface 801 defining a first annular channel 805 as previously described, and which may deliver precursors to central aperture 803 through delivery apertures 807 as discussed above. Additionally, an input aperture 810 may extend from first surface 801 of gasbox 800 through second surface 802. As discussed previously, input aperture 810 may be fluidly coupled with an inlet manifold, such as a second channel of the inlet manifold to receive additional precursors.

Input aperture 810 may also deliver precursors to channels formed by incorporating an additional gasbox plate 812, which may be welded, bonded, or otherwise coupled with one or more additional plates as illustrated to produce additional channels. In some embodiments, to ensure fluid separation of internal channels, the additional gasbox plate 812 may be diffusion bonded, as welding of interior surfaces may not be practicable, and may otherwise involve more complicated component designs. Additional gasbox plate 812 may be the same material as any other gasbox plate, and may define one or more radial channels 814, which may extend from input aperture 810 to one or more exterior channels, such as second annular channel 816, which may include or alternatively be one or more recursive channels as discussed above, for outwardly distributing precursors. For example, radial channel 814 may additionally be a lateral or arcuate channel that distributes precursors to two or more additional channels, which may distribute precursors to multiple locations of second annular channel 816.

The gasbox 800 may also define one or more outlet apertures 818, such as with additional gasbox plate 812, and which may extend from second annular channel 816 through second surface 802 of the gasbox. A number of outlet apertures 818 may be included or defined in the gasbox in embodiments. Gasbox 800 may also define a cooling channel 820 as previously described, and which may be sealed with top cover 825. Each of top cover 825, additional gasbox plate 812, and the base plate may be the same materials or different materials in embodiments, and may be welded, bonded, or otherwise coupled in a number of ways to produce gasbox 800.

Figure 9C:
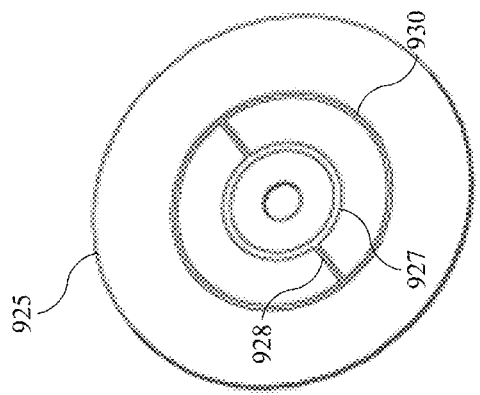
FIGS. 9A-9C show schematic isometric views of plates of an exemplary gasbox according to some embodiments of the present technology.
Figure 9B:
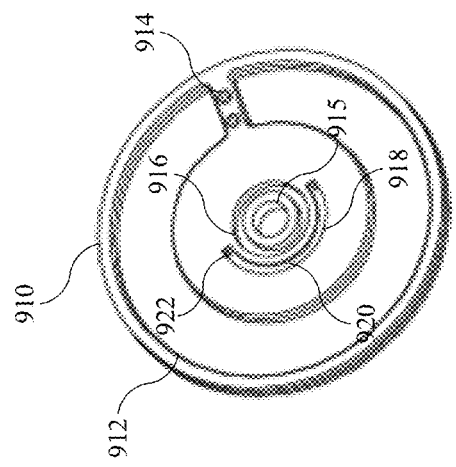
Figure 9A:
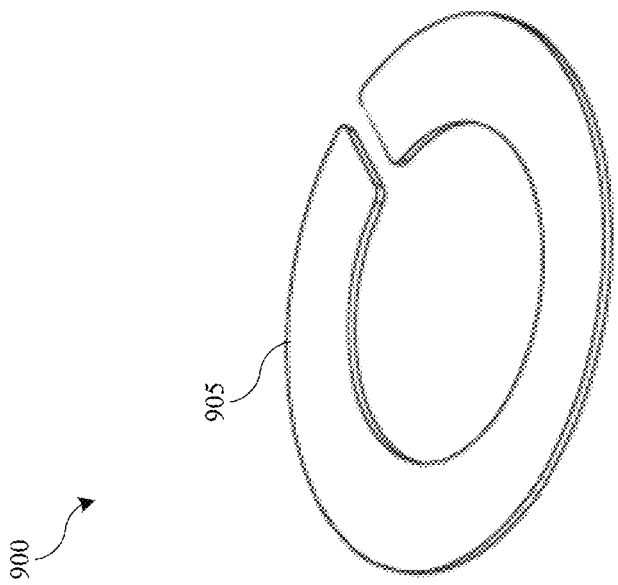

FIGS. 9A-9C show schematic isometric views of plates of an exemplary gasbox 900 according to some embodiments of the present technology, and which may illustrate one encompassed example of a recursive flow path as discussed previously, such as with a second annular channel, for example. The figures illustrate plates that may be coupled in one or more ways to define flow paths for distributing precursors. Gasbox 900 may include any feature of gasbox configurations or characteristics described above. Additionally, gasbox 900 may be included in any chamber discussed above, or may be part of any lid stack including any previously noted component. Gasbox 900 may include multiple plates as illustrated, which may be clamped, bonded, welded, bolted, coupled, or joined together to define characteristics of the gasbox.

FIG. 9A illustrates a top plate 905, which may be coupled with middle plate 910, as illustrated in FIG. 9B. For example, top plate 905 may be fixedly coupled with middle plate 910 about a recessed channel 912 defined within an upper surface of the middle plate, and which may define a cooling channel as previously described. Middle plate may include one or more fluid delivery ports 914, which may provide access to and from the cooling channel. Middle plate 910 may define a central aperture 915 as discussed previously, as well as a first annular channel 916, which may define apertures as previously described to produce a flow path to the central aperture. Middle plate 910 may also define features that may operate to provide or define a flow path for a second precursor. For example, on the upper surface of the middle plate 910 may be defined a recessed channel 918. An aperture through a manifold as described previously may access recessed channel 918 near a middle or midpoint of the channel, which may allow a delivered precursor to then travel in two directions along the channel.

Recessed channel 918 may extend to two or more distal ends, which may access apertures 922 extending from the upper surface of the middle plate through the middle plate. The apertures 922 may provide fluid access to a bottom plate 925, as illustrated in FIG. 9C, and which may be coupled with a bottom surface of the middle plate 910 opposite an upper surface of the plate. Bottom plate 925 may define a channel configuration to further distribute a precursor. As illustrated, the bottom plate may define an interior channel 927, which may receive a delivered precursor from apertures 922 through middle plate 910. One or more radial channels 928 may extend between interior channel 927 and an exterior channel 930. Although two such radial channels 928 are illustrated, it is to be understood that any number of radial channels may be included, such as 2, 3, 4, 6, 8, or more radial channels in embodiments of the present technology.

Exterior channel 930 may define a plurality of apertures extending through the bottom plate 925, which may allow delivery of a precursor from the gasbox 900. Any number of perforations or apertures may be defined along exterior channel 930, and the apertures may be spaced about radial channels 928 to provide more uniform delivery. For example, in some embodiments no aperture may be defined in exterior channel 930 directly in line with any radial channel 928, although in other embodiments apertures may be included in line. By including additional precursor delivery paths through lid stacks or components of the present technology, a number of process improvements may be afforded. Wafer film thickness uniformity, material composition, and film properties may be further tuned to improve processes, limit in-plane distortion, and control film properties across the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
   an inlet manifold defining a central aperture, wherein the inlet manifold further defines a first channel and a second channel, each of the first channel and the second channel extending through the inlet manifold at a position radially outward of the central aperture; and
   a gasbox characterized by a first surface facing the inlet manifold and a second surface opposite the first surface, wherein:
      the gasbox defines a central aperture axially aligned with the central aperture of the inlet manifold;
      the gasbox defines a first annular channel in the first surface extending about the central aperture of the gasbox and fluidly coupled with the first channel defined by the inlet manifold;
      the gasbox defines a second annular channel extending radially outward of the first annular channel and fluidly coupled with the second channel defined by the inlet manifold;
      the second annular channel is fluidly isolated from the first annular channel;
      the second annular channel is defined in the first surface of the gasbox and extends about and concentric with the first annular channel; and
      the gasbox defines fluid access from the second annular channel to a plurality of delivery channels defined within the gasbox, each of the plurality of delivery channels having a longitudinal axis that extends radially outward from the second annular channel.

2. The semiconductor processing chamber of claim 1, wherein each delivery channel of the plurality of delivery channels defines one or more outlet apertures positioned radially outward of the second annular channel.

3. The semiconductor processing chamber of claim 1, wherein the gasbox defines a cooling channel in the first surface of the gasbox radially outward of the first annular channel.

4. The semiconductor processing chamber of claim 1, wherein the gasbox defines a plurality of delivery apertures through the first annular channel of the gasbox, and wherein the plurality of delivery apertures provide fluid access between the first annular channel and the central aperture of the gasbox.

5. A semiconductor processing chamber gasbox, comprising:
   a first surface and a second surface opposite the first surface, wherein:
      the semiconductor processing chamber gasbox defines a central aperture extending through the semiconductor processing chamber gasbox along a central axis through the semiconductor processing chamber gasbox,
      the semiconductor processing chamber gasbox defines a first annular channel in the first surface extending about the central aperture of the semiconductor processing chamber gasbox,
      the semiconductor processing chamber gasbox defines a second annular channel extending radially outward of the first annular channel and fluidly accessible from the first surface of the semiconductor processing chamber gasbox, and
      the second annular channel is fluidly isolated from the first annular channel,
      the second annular channel is defined in the first surface of the gasbox and extends about and concentric with the first annular channel, and
      the gasbox defines fluid access from the second annular channel to a plurality of delivery channels defined within the gasbox, each of the plurality of delivery channels having a longitudinal axis that extends radially outward from the second annular channel.

6. The semiconductor processing chamber gasbox of claim 5, wherein each delivery channel of the plurality of delivery channels defines one or more outlet apertures positioned radially outward of the second annular channel.

7. The semiconductor processing chamber gasbox of claim 5, wherein the gasbox defines a cooling channel in the first surface of the gasbox radially outward of the first annular channel.

8. The semiconductor processing chamber gasbox of claim 5, wherein the gasbox defines a plurality of delivery apertures through the first annular channel of the gasbox, and wherein the plurality of delivery apertures provide fluid access between the first annular channel and the central aperture of the gasbox.

9. A semiconductor processing system comprising:
   a semiconductor processing chamber;
   an inlet manifold coupled with the semiconductor processing chamber and defining a central aperture providing fluid access into the semiconductor processing chamber, wherein the inlet manifold further defines a first channel and a second channel, each of the first channel and the second channel extending through the inlet manifold at a location radially outward of the central aperture;
   a blocker plate providing fluid access to a processing region of the semiconductor processing chamber; and
   a gasbox characterized by a first surface facing the inlet manifold and a second surface opposite the first surface, wherein:
      the gasbox defines a central aperture axially aligned with the central aperture of the inlet manifold;
      the gasbox defines a first annular channel in the first surface extending about the central aperture of the gasbox and fluidly coupled with the first channel defined by the inlet manifold;

the gasbox defines a second annular channel formed radially outward of the first annular channel and fluidly coupled with the second channel defined by the inlet manifold, and a cooling channel formed radially outward of the first annular channel and defined in the first surface of the gasbox;

the second annular channel is defined in the first surface of the gasbox and extends about and concentric with the first annular channel; and the gasbox defines fluid access from the second annular channel to a plurality of delivery channels defined within the gasbox, each of the plurality of delivery channels having a longitudinal axis that extends radially outward from the second annular channel.

10. The semiconductor processing system of claim 9, wherein the gasbox defines a first fluid port providing fluid access to the cooling channel, and wherein the gasbox defines a second fluid port providing fluid access from the cooling channel.

11. A semiconductor processing chamber gasbox, comprising: a first surface and a second surface opposite the first surface, wherein: the semiconductor processing chamber gasbox defines a central aperture extending through the semiconductor processing chamber gasbox along a central axis through the semiconductor processing chamber gasbox; the semiconductor processing chamber gasbox defines a first annular channel in the first surface extending about the central aperture of the semiconductor processing chamber gasbox; the semiconductor processing chamber gasbox defines a second annular channel extending radially outward of the first annular channel and fluidly accessible from the first surface of the semiconductor processing chamber gasbox; the semiconductor processing chamber gasbox defines an input aperture that is fluidly coupled with the second annular channel and that extends through the gasbox from the first surface to the second surface, wherein the input aperture through the gasbox is fluidly coupled with one or more conductance paths defined at the second surface and extending radially outward from the input aperture through the gasbox to the downstream second annular channel; the second annular channel is fluidly isolated from the first annular channel; and the second annular channel is defined in the second surface of the gasbox.

12. The semiconductor processing chamber gasbox of claim 11, wherein the second annular channel defines a plurality of outlet apertures.

13. The semiconductor processing chamber gasbox of claim 11, wherein at least one conductance path of the one or more conductance paths comprises a different size than at least one other conductance path of the one or more conductance paths.

14. The semiconductor processing chamber gasbox of claim 11, wherein the input aperture through the gasbox is radially outward from the central aperture.

* * * * *